US009281216B2

(12) United States Patent
Torigoe et al.

(10) Patent No.: US 9,281,216 B2
(45) Date of Patent: Mar. 8, 2016

(54) MANUFACTURING METHOD OF EPITAXIAL SILICON WAFER

(71) Applicant: SUMCO CORPORATION, Tokyo (JP)

(72) Inventors: Kazuhisa Torigoe, Tokyo (JP); Toshiaki Ono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/754,762

(22) Filed: Jun. 30, 2015

(65) Prior Publication Data
US 2016/0035583 A1 Feb. 4, 2016

(30) Foreign Application Priority Data

Jul. 29, 2014 (JP) ................. 2014-153984

(51) Int. Cl.
*H01L 21/322* (2006.01)
*H01L 21/02* (2006.01)
*C30B 25/10* (2006.01)
*H01L 21/20* (2006.01)
*C30B 25/02* (2006.01)

(52) U.S. Cl.
CPC ............ *H01L 21/3221* (2013.01); *C30B 25/10* (2013.01); *H01L 21/0262* (2013.01); *H01L 21/02381* (2013.01); *C30B 25/02* (2013.01); *H01L 21/20* (2013.01); *H01L 21/3225* (2013.01)

(58) Field of Classification Search
CPC ........ C30B 25/02; C30B 25/10; H01L 21/20; H01L 21/3225
USPC .......................................... 438/471
See application file for complete search history.

(56) References Cited

U.S. PATENT DOCUMENTS 9,080,253 B2 7/2015 Wada
2005/0247259 A1* 11/2005 Yoon ...................... C30B 29/06
117/13

FOREIGN PATENT DOCUMENTS

JP 11-243093 9/1999

* cited by examiner

*Primary Examiner* — Karen Kusumakar
(74) *Attorney, Agent, or Firm* — Greenblum & Bernstein, P.L.C.

(57) ABSTRACT

A manufacturing method of an epitaxial silicon wafer includes: an epitaxial-film-growth step in which an epitaxial film is grown on a silicon wafer in a reaction container, and a temperature reduction step in which a temperature of the epitaxial silicon wafer is reduced from a temperature at which the epitaxial film is grown. In the temperature reduction step, a temperature reduction rate of the epitaxial silicon wafer is controlled to satisfy a relationship represented by $R \leq 2.0 \times 10^{-4} X^{-2.9}$, where $X$ ($\Omega \cdot cm$) represents a resistivity of the silicon wafer, and $R$ (degrees C./min) represents the temperature reduction rate for lowing the temperature of the epitaxial silicon wafer from 500 degrees C. to 400 degrees C.

3 Claims, 4 Drawing Sheets

F I G . 1
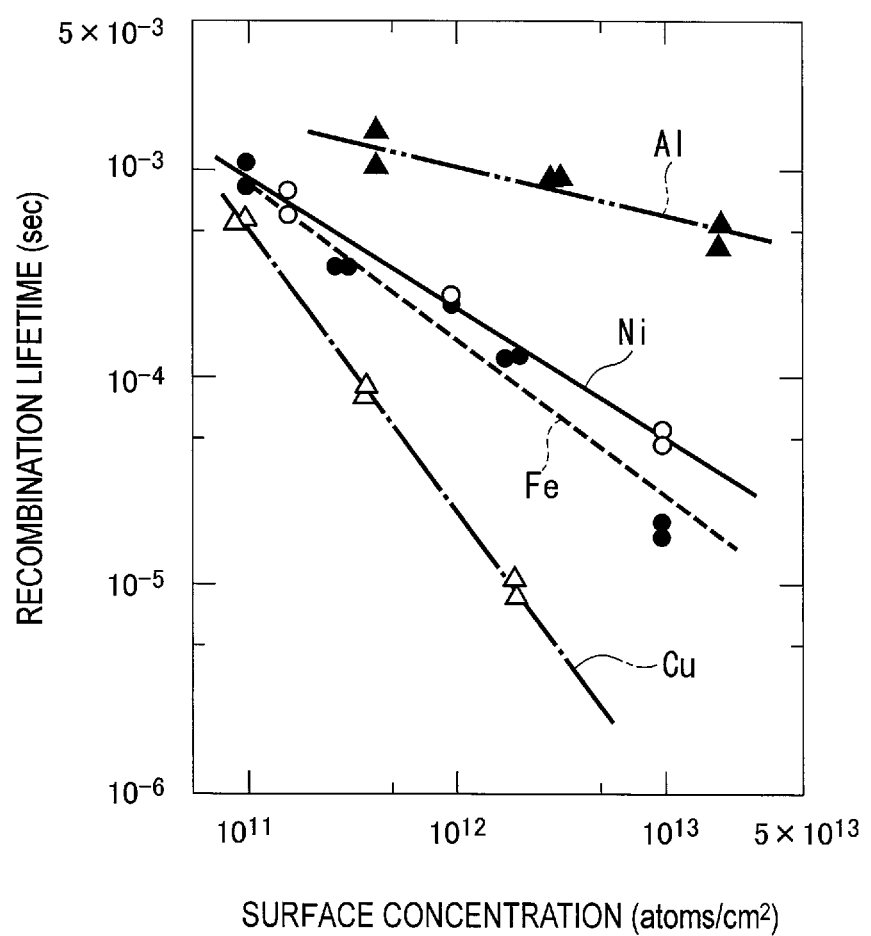

MANUFACTURING METHOD OF EPITAXIAL SILICON WAFER

The entire disclosure of Japanese Patent Application No. 2014-153984 filed Jul. 29, 2014 is expressly incorporated by reference herein.

TECHNICAL FIELD

The present invention relates to a method of manufacturing an epitaxial silicon wafer.

BACKGROUND ART

It has been known to produce an epitaxial silicon wafer by vapor phase growth of an epitaxial film on a surface of a silicon wafer obtained by cutting a monocrystal silicon.

When the epitaxial film of the epitaxial silicon wafer is contaminated with metal impurities, semiconductor device performance is deteriorated. Hence, studies have been made in order to remove the contamination on an epitaxial film caused by metal impurities (see, for instance, Patent Literature 1: JP-A-11-243093).

Patent Literature 1 discloses a method for obtaining a semiconductor device, in which the contamination caused by nickel (metal impurities) is removed. Specifically, Patent Literature 1 discloses: growing an epitaxial film on a surface of a low-resistance silicon wafer ($p^+$ silicon wafer) containing boron; and cooling the epitaxial silicon wafer in a temperature range (from 900 degrees C. to 700 degrees C.) at a cooling rate of 40 degrees C./min or less, thereby obtaining an epitaxial silicon wafer whose oxygen precipitation density is in an order of $10^5$ to $10^7/cm^2$.

The epitaxial silicon wafer having the above oxygen precipitation density is thermally treated in a manufacturing process of the semiconductor device, whereby nickel in the epitaxial film is removed by intrinsic gettering and an epitaxial silicon wafer from which the contamination caused by nickel is removed can be obtained.

In recent years, the heat treatment temperature in the manufacturing process of semiconductor device has come to be reduced to, for instance, less than 900 degrees C. When the heat treatment temperature is thus reduced, it is possible that nickel in the epitaxial silicon wafer obtained by the method disclosed in Patent Literature 1 is not sufficiently removed by intrinsic gettering.

SUMMARY OF THE INVENTION

An object of the invention is to provide a manufacturing method of an epitaxial silicon wafer capable of obtaining an epitaxial silicon wafer from which contamination caused by nickel is removed, irrespective of the heat treatment temperature after manufacture.

After vigorous studies, the inventors of the invention have gotten the following findings on a temperature reduction step in which a temperature of an epitaxial silicon wafer is reduced from a temperature during an epitaxial-film-growth step.

At a temperature exceeding 500 degrees C., since a segregation coefficient of nickel does not rise to a value capable of obtaining segregation gettering effect, it is possible that the contamination caused by nickel cannot be removed. Further, at a temperature less than 400 degrees C., since nickel comes to deposit on the surface of the epitaxial film, the contamination caused by nickel may not be removed. On the other hand, in a temperature range from 400 degrees C. to 500 degrees C., since the segregation coefficient of nickel rises to a value capable of obtaining the segregation gettering effect before nickel starts depositing on the surface of the epitaxial film, it is possible that the contamination caused by nickel can be removed. In view of the above, the inventors conducted the following experiments.

Experiment 1

A plurality of monocrystal ingots each with a different additive amount of boron were prepared according to CZ process (Czochralski process). Silicon wafers were respectively cut out of the monocrystal ingots. Resistivity of each of the silicon wafers (sometimes referred to as "substrate resistivity" hereinafter) is shown in Table 1.

The (100) surface of the silicon wafer was processed to form a mirror polished surface. After the mirror polished surface was contaminated with nickel at a concentration of $2 \times 10^{12}$ atom/$cm^2$, an epitaxial film of 5 μm thickness was grown thereon. The epitaxial film was grown in a gas (e.g. trichlorosilane) atmosphere at a temperature around 1150 degrees C. The resistivity of the epitaxial film was in a range from 0.015 Ω·cm to 1000 Ω·cm.

Then, the temperature of the epitaxial silicon wafer was reduced from the temperature at which the epitaxial film was grown (temperature reduction step). In the temperature reduction step, a temperature reduction rate (sometimes referred to as a "first-range temperature reduction rate" hereinafter) for reducing the temperature from the temperature at which the epitaxial film was grown to 500 degrees C. was controlled at 500 degrees C./min. A temperature reduction rate (sometimes referred to as a "second-range temperature reduction rate" hereinafter) for subsequently reducing the temperature from 500 degrees C. to 400 degrees C. was controlled according to the conditions shown in Table 1. When the temperature of the epitaxial silicon wafer was reduced to a range from 350 degrees C. to 400 degrees C., the epitaxial silicon wafer was taken out of a reaction container and was rapidly cooled to a room temperature. Subsequently, the nickel concentration of the epitaxial film was measured. Specifically, nickel in the epitaxial film was collected and analyzed using DSE (one Drop Sandwich Etching)-ICP-MS (Inductively Coupled Plasma Mass Spectrometry) method. The nickel concentration in the epitaxial film is shown in Table 1.

Further, based on the nickel concentration of the epitaxial film, the presence/absence of segregation gettering effect on nickel was determined. The results are shown in Table 1. The presence/absence of the segregation gettering effect on nickel can be determined using the above method because, when the segregation gettering effect is present, nickel is gettered in the silicon wafer so that the nickel concentration in the epitaxial film is reduced, and, on the other hand, when the segregation gettering effect is not present, nickel is not gettered in the silicon wafer so that the nickel concentration in the epitaxial film is not reduced. A first threshold for determining the presence/absence of the segregation gettering effect in Experiment 1 was set at $1 \times 10^{11}$ atoms/$cm^2$. This is because, when the nickel concentration is at or above the first threshold, a lifetime becomes 1000 μsec or more as shown in FIG. 1.

TABLE 1

| substrate resistivity (Ω·cm) | Second-range (500 degrees C. → 400 degrees C.) temperature reduction rate (degrees C./min) | Nickel concentration of epitaxial film (atoms/$cm^2$) | Presence/absence of segregation gettering effect Present (less than 1st threshold): ○ Absent (at or more than 1st threshold): × (1st threshold = $1 \times 10^{11}$ atoms/$cm^2$) |
|---|---|---|---|
| 0.005 | 500 | $3.9 \times 10^{10}$ | ○ |
|  | 300 | $4.6 \times 10^{10}$ | ○ |
|  | 200 | $3.4 \times 10^{10}$ | ○ |
|  | 100 | $2.5 \times 10^{10}$ | ○ |
|  | 50 | $1.8 \times 10^{10}$ | ○ |

TABLE 1-continued

| substrate resistivity ($\Omega \cdot$ cm) | Second-range (500 degrees C. → 400 degrees C.) temperature reduction rate (degrees C./min) | Nickel concentration of epitaxial film (atoms/cm$^2$) | Presence/absence of segregation gettering effect Present (less than 1st threshold): ○ Absent (at or more than 1st threshold): × (1st threshold = 1 ×10$^{11}$ atoms/cm$^2$) |
|---|---|---|---|
| 0.008 | 500 | $3.2 \times 10^{11}$ | × |
|  | 300 | $4.3 \times 10^{11}$ | × |
|  | 200 | $2.2 \times 10^{11}$ | × |
|  | 100 | $9.5 \times 10^{10}$ | ○ |
|  | 50 | $6.7 \times 10^{10}$ | ○ |
| 0.012 | 500 | $7.7 \times 10^{11}$ | × |
|  | 300 | $6.8 \times 10^{11}$ | × |
|  | 200 | $5.1 \times 10^{11}$ | × |
|  | 100 | $3.5 \times 10^{11}$ | × |
|  | 50 | $9.8 \times 10^{10}$ | ○ |
| 0.015 | 500 | $8.9 \times 10^{10}$ | × |
|  | 300 | $6.2 \times 10^{11}$ | × |
|  | 200 | $7.4 \times 10^{11}$ | × |
|  | 100 | $5.0 \times 10^{11}$ | × |
|  | 50 | $6.4 \times 10^{11}$ | × |

It is found that, as long as the substrate resistivity is constant, the smaller the second-range temperature reduction rate is (i.e. the more slowly cooled in the second temperature reduction range), the more segregation gettering effect on nickel can be obtained.

Further, based on the results shown in Table 1, whether or not an appropriate temperature reduction rate can be calculated in the second temperature reduction range is determined for each of substrate resistivities. The relationship between the substrate resistivity and the second-range temperature reduction rate is shown in FIG. 2.

As shown in FIG. 2, an approximate curve showing a border between an instance in which the segregation gettering effect is present and an instance in which the segregation gettering effect is absent can be represented by the following formula (1), where the substrate resistivity is X ($\Omega \cdot$cm), and the second-range temperature reduction rate (i.e. a range in which the temperature is reduced from 500 degrees C. to 400 degrees C.) is R (degrees C./min).

$$R = 2.0 \times 10^{-4} X^{-2.9} \quad (1)$$

As can be understood from the above, it is found that the segregation gettering effect can be obtained by setting the second-range temperature reduction rate at or less than R obtained by the above formula (1).

Experiment 2

Except that the mirror polished surface of the silicon wafer was contaminated with nickel at a concentration of $1 \times 10^{11}$ atom/cm$^2$, the epitaxial silicon wafer was prepared and the nickel concentration of the epitaxial film was measured under the same conditions as in Experiment 1. Further, a second threshold for determining the presence/absence of the segregation gettering effect was set at $1 \times 10^9$ atoms/cm$^2$, which was smaller than the first threshold. This is because the initial contamination concentration of nickel was the same as the first threshold in Experiment 1 and thus the presence/absence of the segregation gettering effect could not be correctly determined unless the difference between the initial contamination concentration and the first threshold was set large. It should be noted that the value $1 \times 10^9$ atoms/cm$^2$ is a measurement limit of a currently available measuring machine.

The nickel concentration of the epitaxial film and the results of the determination of the presence/absence of the segregation gettering effect are shown in Table 2.

TABLE 2

| substrate resistivity ($\Omega \cdot$ cm) | Second-range (500 degrees C. → 400 degrees C.) temperature reduction rate (degrees C./min) | Nickel concentration of epitaxial film (atoms/cm$^2$) | Presence/absence of segregation gettering effect Present (less than 2nd threshold): ○ Absent (at or more than 2nd threshold): × (2nd threshold = 1 ×10$^9$ atoms/cm$^2$) |
|---|---|---|---|
| 0.005 | 500 | less than $1 \times 10^9$ | ○ |
|  | 300 | less than $1 \times 10^9$ | ○ |
|  | 200 | less than $1 \times 10^9$ | ○ |
|  | 100 | less than $1 \times 10^9$ | ○ |
|  | 50 | less than $1 \times 10^9$ | ○ |
| 0.008 | 500 | $2.2 \times 10^9$ | × |
|  | 300 | $1.3 \times 10^9$ | × |
|  | 200 | less than $1 \times 10^9$ | ○ |
|  | 100 | less than $1 \times 10^9$ | ○ |
|  | 50 | less than $1 \times 10^9$ | ○ |
| 0.012 | 500 | $2.3 \times 10^9$ | × |
|  | 300 | $1.8 \times 10^9$ | × |
|  | 200 | $1.3 \times 10^9$ | × |
|  | 100 | $1.5 \times 10^9$ | × |
|  | 50 | less than $1 \times 10^9$ | ○ |
| 0.015 | 500 | $2.7 \times 10^9$ | × |
|  | 300 | $2.1 \times 10^9$ | × |
|  | 200 | $2.5 \times 10^9$ | × |
|  | 100 | $1.4 \times 10^9$ | × |
|  | 50 | $2.0 \times 10^9$ | × |

As shown in Table 2, it is found that, as long as the substrate resistivity is constant, the smaller the second-range temperature reduction rate is, the more segregation gettering effect on nickel can be obtained in the same manner as Experiment 1.

The relationship between the substrate resistivity and the second-range temperature reduction rate based on the results shown in Table 2 is shown in FIG. 3.

As shown in FIG. 3, the approximate curve representing a border between an instance in which the segregation gettering effect is present and an instance in which the segregation gettering effect is absent can be represented by a curve substantially similar to the curve represented by the following formula (1).

It is found from the results of Experiment 2 shown in FIG. 3 and the results of Experiment 1 shown in FIG. 2 that the segregation gettering effect can be obtained by setting the second-range temperature reduction rate at value R or less obtained by the above formula (1) even when the initial contamination concentrations of nickel differ.

Experiment 3

Except that the first-range temperature reduction rate was controlled at 50 degrees C./min, the epitaxial silicon wafer was prepared, the nickel concentration of the epitaxial film was measured and the presence/absence of the segregation gettering effect was determined under the same conditions as in Experiment 1.

The results of the presence/absence of the segregation gettering effect at each of the substrate resistivities and the second-range temperature reduction rates were exactly the same as in Experiment 1.

Accordingly, it is found that the first-range temperature reduction rate (i.e. the temperature reduction rate when the temperature is reduced from the temperature at which the epitaxial film was grown to 500 degrees C.) has no influence on nickel concentration after being cooled.

Experiment 4

The epitaxial silicon wafer obtained in Experiment 1 was subjected to a heat treatment simulating a manufacturing process of a semiconductor device (kept at 800 degrees C. for two hours, at 650 degrees C. for three hours, and at 700 degrees C. for an hour). The atmosphere of the heat treatment was a mixture gas of $N_2$ and $O_2$ (3 mass % of $O_2$ was mixed).

It is found that the nickel concentration after the heat treatment is less than the first threshold for all instances in which the segregation gettering effect on nickel can be obtained in Experiment 1.

Experiment 5

The epitaxial silicon wafer obtained in Experiment 1 was subjected to a heat treatment simulating a manufacturing process of a semiconductor device (kept at 500 degrees C. for two hours, at 400 degrees C. for three hours, and at 450 degrees C. for an hour). The atmosphere for the heat treatment was the same as the above Experiment 4.

It is found that the nickel concentration is less than the first threshold for all instances in which the segregation gettering effect on nickel can be obtained in Experiment 1.

From the results of Experiments 4 and 5, it is found that the segregation gettering effect on nickel can be obtained in instances where the second-range temperature reduction rate is set at the value R obtained by the above formula (1) irrespective of the heat treatment conditions simulating the manufacturing process of the semiconductor device.

The invention has been reached based on the above findings.

A manufacturing method of an epitaxial silicon wafer according to an aspect of the invention includes: growing the epitaxial film on the silicon wafer in a reaction container; and reducing a temperature of the epitaxial silicon wafer from a temperature at which the epitaxial film is grown, in which: while reducing the temperature of the epitaxial silicon wafer, a temperature reduction rate of the temperature of the epitaxial silicon wafer is controlled to satisfy a formula $R \leq 2 \times 10$-$4X^{-2.9}$ (formula (1)), where X ($\Omega \cdot cm$) represents a resistivity of the silicon wafer, and R (degrees C./min) represents the temperature reduction rate for reducing the temperature of the epitaxial silicon wafer from 500 degrees C. to 400 degrees C.

According to the above aspect of the invention, a manufacturing method of an epitaxial silicon wafer capable of obtaining an epitaxial silicon wafer from which contamination caused by nickel is removed can be provided only by controlling the temperature reduction rate during the temperature reduction step irrespective of the heat treatment temperature after manufacture.

It should be noted that the "temperature of the epitaxial silicon wafer" in the above aspect of the invention refers to both an actual temperature of the epitaxial silicon wafer and a temperature within a component in which the silicon wafer is to be housed when an epitaxial film is to be grown (e.g. a reaction container of an epitaxial device).

Further, the "temperature reduction rate" of the invention refers to "an average value of the temperature reduction rate." Accordingly, even when the temperature reduction rate does not satisfy the above formula (2) in a part of the temperature range while the temperature is reduced from 500 degrees C. to 400 degrees C., such an instance is still within the scope of the invention as long as an average of the temperatures in the entire temperature range satisfies the above formula (2).

Further, the inventors have conducted the following experiment in order to find appropriate temperature control conditions at or less than the second temperature reduction range.

Experiment 6

Except that a silicon wafer of which substrate resistivity was 0.012 $\Omega \cdot cm$ was used, that the temperature reduction rate for reducing the temperature of the epitaxial silicon wafer from a temperature in a range from 350 degrees C. to 400 degrees C. was controlled at 50 degrees C./min during the temperature reduction step after forming the epitaxial film and that the epitaxial silicon wafer was taken out of a reaction container to be cooled to a room temperature after the temperature was reduced to 100 degrees C., the epitaxial silicon wafer was prepared, the nickel concentration of the epitaxial film was measured and the presence/absence of the segregation gettering effect was determined under the same conditions as in Experiment 1.

As a result, in all of the instances, the nickel concentration after being cooled was at or more than the first threshold and it is found that the segregation gettering effect cannot be obtained.

Accordingly, it is found that, even when the second-range temperature reduction rate is set at the value R obtained according to the above formula (1), if the epitaxial silicon wafer is not rapidly cooled (i.e. without taking out the epitaxial silicon wafer from the reaction container at a temperature in a range from 350 degrees C. to 400 degrees C.) but is gradually cooled (i.e. taking the epitaxial silicon wafer out of the reaction container after the temperature is reduced to 100 degrees C. in the reaction container), the segregation gettering effect cannot be obtained.

In other words, in the manufacturing method of an epitaxial silicon wafer according to the above aspect of the invention, it is preferable that, while reducing the temperature of the epitaxial silicon wafer, the epitaxial silicon wafer of which temperature is in a range of 350 degrees C. or more and less than 400 degrees C. is taken out of the reaction container to reduce the temperature of the epitaxial silicon wafer to a room temperature.

According to the above arrangement, a possibility for obtaining an epitaxial silicon wafer from which contamination caused by nickel is removed can be enhanced irrespective of the heat treatment temperature after manufacture.

It should be noted that the "room temperature" in the invention refers to a temperature in a condition without being heated or cooled from an external system.

Furthermore, in the manufacturing method of an epitaxial silicon wafer according to the above aspect of the invention, it is preferable that the silicon wafer is added with boron, the resistivity of the silicon wafer is in a range from 0.005 $\Omega \cdot cm$ to 0.014 $\Omega \cdot cm$, and a resistivity of the epitaxial film is in a range from 0.015 $\Omega \cdot cm$ to 1000 $\Omega \cdot cm$.

BRIEF DESCRIPTION OF DRAWING(S)

FIG. 1 is a graph showing a relationship between a nickel concentration and a lifetime, the relationship being used for setting a first threshold in Experiment 1 performed in order to derive a formula for defining a temperature reduction rate of the invention.

DESCRIPTION OF EMBODIMENT(S)

Exemplary Embodiment(s)

Exemplary embodiment(s) of the invention will be described below with reference to the attached drawings.

Figure 2:
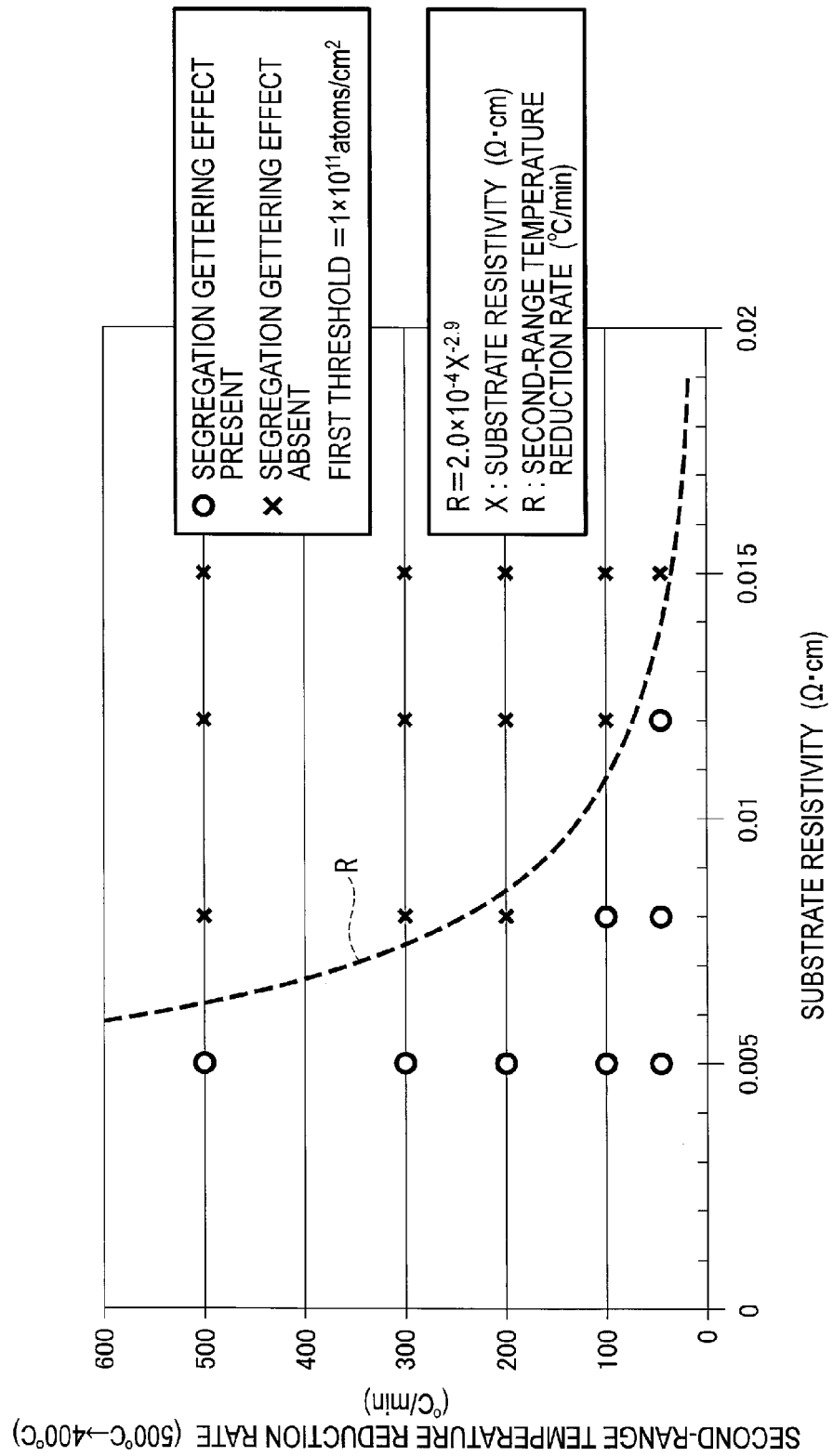
FIG. 2 is a graph showing a result of Experiment 1.
Figure 3:
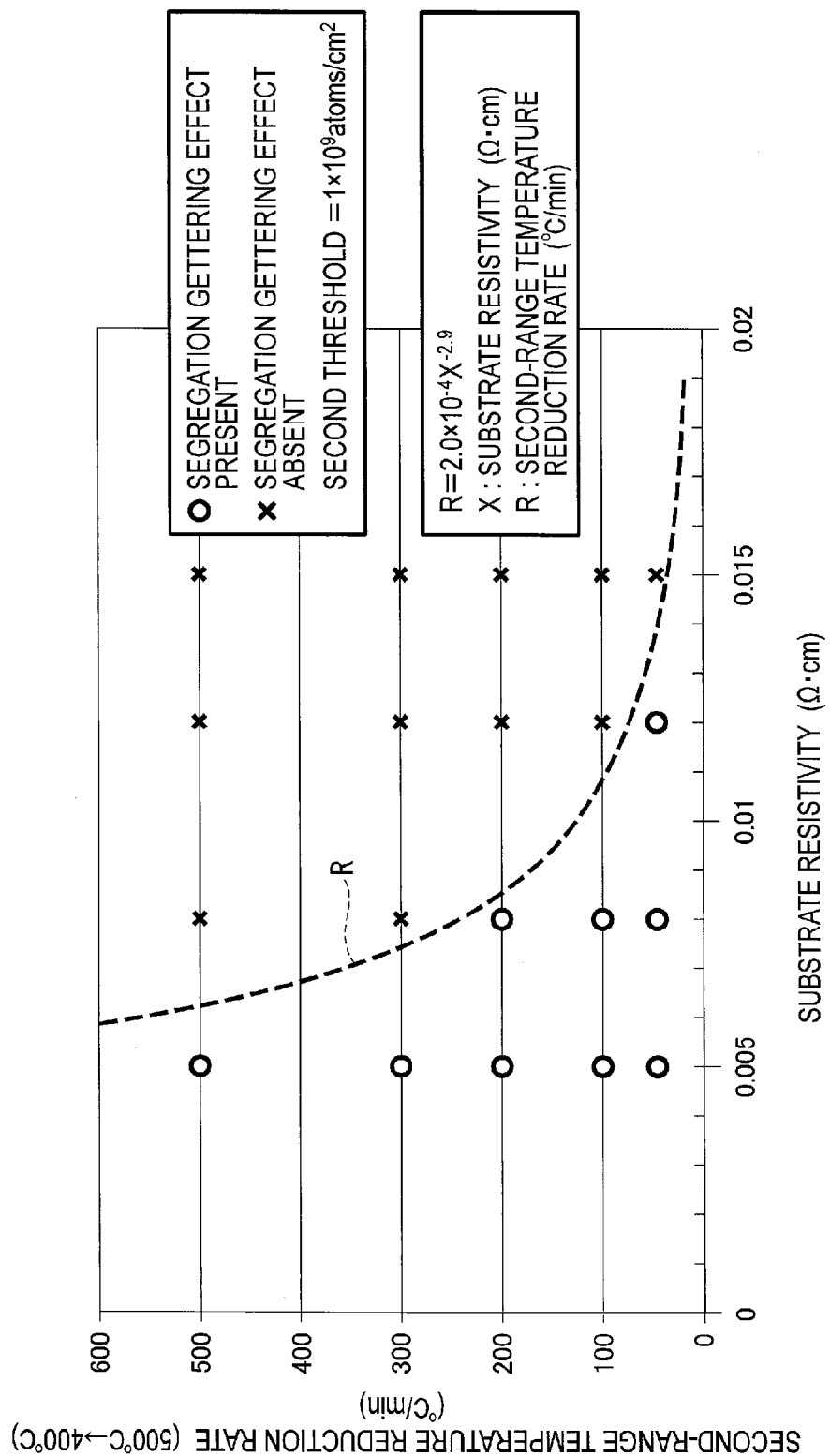
FIG. 3 is a graph showing a result of Experiment 2 performed in order to derive a formula for defining the temperature reduction rate.
Figure 4:
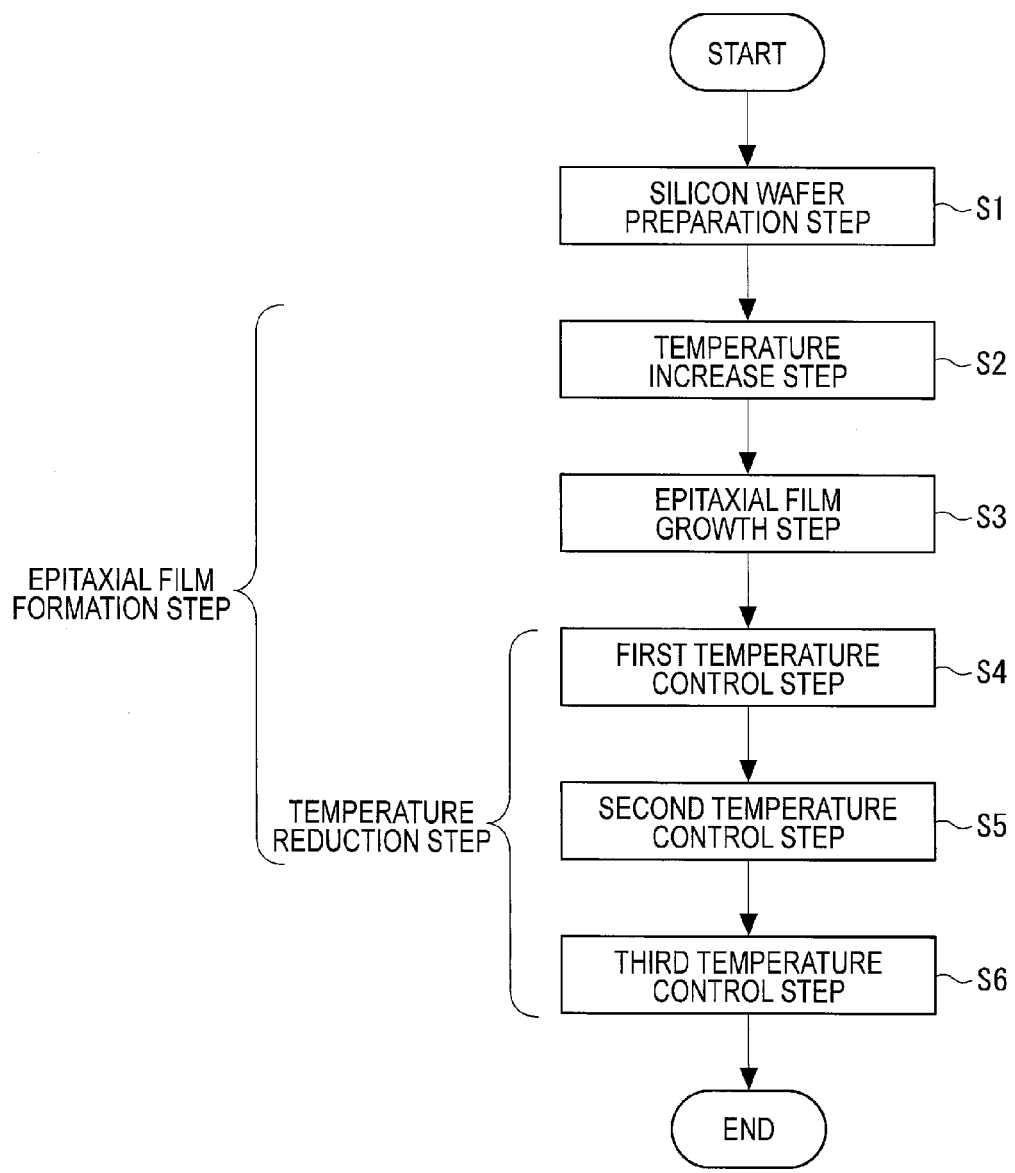
FIG. 4 is a flow chart showing a manufacturing method of an epitaxial silicon wafer according to an exemplary embodiment of the invention.

FIG. 4 is a flow chart showing a manufacturing method of an epitaxial silicon wafer.

As shown in FIG. 4, in the manufacturing method of an epitaxial silicon wafer, a silicon-wafer-preparation step is initially performed (Step S1).

The silicon-wafer-preparation step encompasses all of the steps for preparing a silicon wafer of which surface is mirror-polished from a monocrystal ingot pulled with CZ method or MCZ (Magnetic-field-applied Czochralski) method, including necessary steps of: slicing; chamfering; grinding; lapping; etching; polishing; cleaning and the like of the silicon wafer. At this time, the resistivity of the silicon wafer is preferably in a range from 0.005 Ω·cm to 0.014 Ω·cm. Further, the resistivity of the silicon wafer is preferably adjusted based on an additive amount of boron.

Next, an epitaxial-film-formation step for forming an epitaxial film on the silicon wafer is conducted. The epitaxial-film-formation step includes a temperature increase step (Step S2), an epitaxial-film-growth step (Step S3) and a temperature reduction step.

In the temperature increase step, the silicon wafer is placed in a reaction container of an epitaxial device (not shown) and the temperature in the reaction container is raised from a room temperature to a target temperature. The target temperature is set in a range from 1050 degrees C. to 1280 degrees C. When the temperature in the reaction container reaches the above target temperature, the epitaxial-film-growth step for growing the epitaxial film on the surface of the silicon wafer is conducted.

In the epitaxial-film-growth step, a growth gas such as trichlorosilane is introduced into the reaction container and the epitaxial film is formed in the growth gas atmosphere. It should be noted that necessary dopant(s) such as boron and phosphorus may be added during the film formation.

The epitaxial-film-growth step is conducted until the film thickness of the epitaxial film reaches a thickness in a range from 0.5 μm to 8.0 μm. When the epitaxial film is grown to reach the above thickness, the temperature of the epitaxial silicon wafer is reduced from the temperature at which the epitaxial film is grown (i.e. the above target temperature (1050 degrees C. to 1280 degrees C.)) to a room temperature (temperature reduction step). It should be noted that the resistivity of the epitaxial film is preferably in a range from 0.015 Ω·cm to 1000 Ω·cm.

The temperature reduction step includes a first temperature control step (Step S4), a second temperature control step (Step S5) and a third temperature control step (Step S6).

In the first temperature control step, the temperature is controlled to be reduced from the temperature at which the epitaxial film is grown to 500 degrees C. The temperature reduction rate in the first temperature control step is preferably in a range from 500 degrees C./min to 1000 degrees C./min.

In the second temperature control step, the temperature is controlled to be reduced from 500 degrees C. to 400 degrees C. Specifically, the temperature reduction rate is controlled to satisfy the above formula (2), where the temperature reduction rate is R (degrees C./min) and the resistivity of the silicon wafer is X (Ω·cm).

In the third temperature control step, the temperature is controlled to be reduced from 400 degrees C. to a room temperature. Specifically, the epitaxial silicon wafer of which temperature is in a range of 350 degrees C. or more and less than 400 degrees C. is taken out of the reaction container to reduce the temperature of the epitaxial silicon wafer to the room temperature, thereby completing the manufacture of the epitaxial silicon wafer.

Advantage(s) of Exemplary Embodiment(s)

As described above, the above exemplary embodiments provide the following advantages.

(1) An epitaxial silicon wafer from which contamination caused by nickel is removed can be simply obtained only by controlling the temperature reduction rate during the second temperature control step of the temperature reduction step irrespective of the heat treatment temperature after manufacture.

(2) A possibility of obtaining an epitaxial silicon wafer from which contamination caused by nickel is removed can be simply enhanced only by taking out an epitaxial silicon wafer of which temperature is less than 400 degrees C. and 350 degrees C. or more during the third temperature control step of the temperature reduction step irrespective of the heat treatment temperature after manufacture.

MODIFICATION(S)

It should be understood that the scope of the invention is not limited to the above exemplary embodiment(s), but various improvement(s) and modification(s) of design are possible as long as such improvement(s) and modification(s) are compatible with an object of the invention.

Specifically, in the third temperature control step of the temperature reduction step, it is not necessary to take out the epitaxial silicon wafer of which temperature is 350 degrees C. or more and less than 400 degrees C. from the reaction container, but the temperature in the reaction container may be controlled so that the temperature reduction rate becomes similar to that in the instance in which the epitaxial silicon wafer is taken out of the reaction container. The temperature reduction rate at this time is preferably in a range from 100 degrees C./min to 1000 degrees C./min.

What is claimed is:

1. A manufacturing method of an epitaxial silicon wafer comprising a silicon wafer and an epitaxial film provided on a surface of the silicon wafer, the method comprising:
    growing the epitaxial film on the silicon wafer in a reaction container; and
    reducing a temperature of the epitaxial silicon wafer from a temperature at which the epitaxial film is grown, wherein, while reducing the temperature of the epitaxial silicon wafer, a temperature reduction rate of the temperature of the epitaxial silicon wafer is controlled to satisfy a formula $R \leq 2.0 \times 10^{-4} X^{-2.9}$ . . . (formula (1)), where X (Ω·cm) represents a resistivity of the silicon wafer, and R (degrees C./min) represents the temperature reduction rate for reducing the temperature of the epitaxial silicon wafer from 500 degrees C. to 400 degrees C.

2. The manufacturing method of an epitaxial silicon wafer according to claim 1, wherein,
    while reducing the temperature of the epitaxial silicon wafer, the epitaxial silicon wafer of which temperature is in a range of 350 degrees C. or more and less than 400 degrees C. is taken out of the reaction container to reduce the temperature of the epitaxial silicon wafer to a room temperature.

3. The manufacturing method of an epitaxial silicon wafer according to claim 1, wherein
    the silicon wafer is added with boron,
    the resistivity of the silicon wafer is in a range from 0.005 Ω·cm to 0.014 Ω·cm, and
    a resistivity of the epitaxial film is in a range from 0.015 Ω·cm to 1000 Ω·cm.

* * * * *